US008700199B2

(12) United States Patent
Erturk et al.

(10) Patent No.: US 8,700,199 B2
(45) Date of Patent: Apr. 15, 2014

(54) PASSIVE RESONATOR, A SYSTEM INCORPORATING THE PASSIVE RESONATOR FOR REAL-TIME INTRA-PROCESS MONITORING AND CONTROL AND AN ASSOCIATED METHOD

(75) Inventors: Mete Erturk, Alburg, VT (US); Ezra D. B. Hall, Richmond, VT (US); Kirk D. Peterson, Jericho, VT (US)

(73) Assignee: International Business Machines Corporation, Armonk, NY (US)

(*) Notice: Subject to any disclaimer, the term of this patent is extended or adjusted under 35 U.S.C. 154(b) by 363 days.

(21) Appl. No.: 13/052,346

(22) Filed: Mar. 21, 2011

(65) Prior Publication Data

US 2012/0245724 A1    Sep. 27, 2012

(51) Int. Cl.
*G06F 19/00* (2011.01)
(52) U.S. Cl.
USPC ............ 700/108; 700/121; 333/185; 333/175
(58) Field of Classification Search
None
See application file for complete search history.

(56) References Cited

U.S. PATENT DOCUMENTS

| | | | |
|---|---|---|---|
| 6,180,995 B1 | 1/2001 | Hebert | |
| 6,182,510 B1 | 2/2001 | Stanke et al. | |
| 6,686,755 B2 * | 2/2004 | White et al. | 324/754.31 |
| 6,987,432 B2 * | 1/2006 | Lutz et al. | 333/186 |
| 2002/0006740 A1 | 1/2002 | Kamieniecki et al. | |
| 2003/0042915 A1 | 3/2003 | Kong et al. | |
| 2006/0186971 A1 * | 8/2006 | Lutz et al. | 333/186 |
| 2006/0234398 A1 | 10/2006 | Gluschenkov et al. | |
| 2007/0224712 A1 | 9/2007 | Kaushal et al. | |
| 2008/0090309 A1 * | 4/2008 | Ranish et al. | 438/5 |
| 2009/0239313 A1 | 9/2009 | Anemikos et al. | |
| 2009/0240452 A1 | 9/2009 | Anemikos et al. | |
| 2011/0152725 A1 * | 6/2011 | Demir et al. | 600/587 |

OTHER PUBLICATIONS

Hopcroft, M.A.; Kim, B.; Chandorkar, S.; Melamud, R.; Agarwal, M.; Jha, C.M.; Bahl, G.; Salvia, J.; Mehta, H.; Lee, H.K.; Candler, R.N.; Kenny, T.W., "Using the temperature dependence of resonator quality factor as a thermometer," Applied Physics Letters , vol. 91, No. 1, pp. 013505,013505-3, Jul. 2007 doi: 10.1063/1.2753758.*
Jha, C.M.; Bahl, G.; Melamud, R.; Chandorkar, S.A.; Hopcroft, M.A.; Kim, B.; Agarwal, M.; Salvia, J.; Mehta, H.; Kenny, T.W., "High resolution microresonator-based digital temperature sensor," Applied Physics Letters , vol. 91, No. 7, pp. 074101,074101-3, Aug. 2007 doi: 10.1063/1.2768629.*

* cited by examiner

*Primary Examiner* — Kavita Padmanabhan
*Assistant Examiner* — Christopher E Everett
(74) *Attorney, Agent, or Firm* — Gibb & Riley, LLC; David A. Cain, Esq.

(57) ABSTRACT

Disclosed is a resonator made up of three sections (i.e., first, second and third sections) of a semiconductor layer. The second section has an end abutting the first section, a middle portion (i.e., an inductor portion) coiled around the first section and another end abutting the third section. The first and third sections exhibit a higher capacitance to the wafer substrate than the second section. Also disclosed are a process control system and method that incorporate one or more of these resonators. Specifically, during processing by a processing tool, wireless interrogation unit(s) detect the frequency response of resonator(s) in response to an applied stimulus. The detected frequency response is measured and used as the basis for making real-time adjustments to input settings on the processing tool (e.g., as the basis for making real-time adjustments to the temperature setting(s) of an anneal chamber).

12 Claims, 8 Drawing Sheets

PASSIVE RESONATOR, A SYSTEM INCORPORATING THE PASSIVE RESONATOR FOR REAL-TIME INTRA-PROCESS MONITORING AND CONTROL AND AN ASSOCIATED METHOD

BACKGROUND

1. Field of the Invention

The embodiments of the invention generally relate to intra-process monitoring and control and, more particularly, to embodiments of a passive resonator capable of being wirelessly interrogated during processing by a processing tool, a system incorporating the passive resonator for real-time intra-process monitoring and control, and an associated method.

2. Description of the Related Art

As lithographic geometries are reduced for each successive semiconductor process generation, the effects of process variability have become significant first order issues. Designers are faced with creating tradeoffs between timing margin, power, and performance. Tighter process controls enable lower power, higher performance, and/or higher yielding products. However, the ability to control processes to tighter tolerances is limited by difficulties encountered in obtaining actual in-line (i.e., intra-process) measurements for a given wafer or for a given site on a given wafer.

For example, during rapid thermal anneal (RTA) processes, temperature variations can occur between RTA chambers and within a single chamber from wafer to wafer and at different locations on a single wafer. Such temperature variations can result in variations in dopant activation, dopant diffusion rates, etc., and can thereby result in performance variations from chip to chip and/or from device to device on a single chip. Unfortunately, local on-wafer temperature measurements can not generally be obtained during RTA processing. Thus, current RTA process control techniques involve iterative process and measurement sequences that are used to achieve average process conditions between and within RTA chambers. However, such techniques are costly in terms of time and yield. Therefore, there is a need in the art for an on-wafer (e.g., either on-chip or within the scribe-line) structure that allows for intra-process monitoring and, particularly, intra-anneal monitoring of on-wafer conditions (e.g., temperature) and that, thereby allows for real-time process control.

SUMMARY

In view of the foregoing, disclosed herein are embodiments of a passive resonator that can be formed in a single semiconductor layer of a semiconductor wafer, that can be used for intra-process monitoring and, particularly, intra-anneal monitoring of on-wafer conditions (e.g., temperature) and that, thereby can be used for real-time process control. This passive resonator can comprise three discrete sections of the same semiconductor layer (i.e., a first section, a second section and a third section). The first section can have a defined shape (e.g., a polygon or oval). The second section can have a first end positioned laterally adjacent to and abutting the first section, a middle portion coiled around the first section (i.e., a planar spiral coil inductor portion wrapped multiple times around the first section), and a second end opposite the first end. The third section can be positioned laterally adjacent to and can abut the second end of the second section. The dimensions and shapes of these three discrete sections can be such that the quality (Q) factor of the resonator, which represents the effect of electrical resistance, is at a level sufficient to ensure that the frequency response of the resonator is indicative of the resistance of the resonator, which in turn is indicative of the temperature of the resonator.

Also disclosed are embodiments of a process control system incorporating one or more the above-described passive resonators on a semiconductor wafer. Specifically, the process control system can comprise at least a processing tool, one or more wireless interrogation units and a controller in communication with the processing tool and the interrogation unit(s). The processing tool can process the semiconductor wafer. The interrogation unit(s) can be positioned adjacent to the resonator(s) and, during processing, can apply a stimulus signal to the resonator(s) and can further detect the frequency response of the resonator(s) in response to the stimulus signal. Based on the detected frequency response, the controller can automatically adjust input setting(s) for the processing tool. That is, detected frequency response can be measured and used, by the controller, as the basis for adjusting input setting(s) on the processing tool during processing (i.e., as the basis for making real-time adjustments). For example, during an anneal process performed on a semiconductor wafer by an anneal chamber, detected frequency response can be measured and used, by the controller, as the basis for adjusting temperature setting(s) of the anneal chamber.

Also disclosed are embodiments of a process control method incorporating one or more the above-described passive resonators on a semiconductor wafer. Specifically, the process control method can comprise processing the semiconductor wafer using a processing tool. During processing one or more wireless interrogation unit(s) can be used to apply a stimulus signal to the resonator(s) and further to detect the frequency response of the resonator(s) in response to the applied stimulus signal. Then, based on the frequency response and during processing, the input setting(s) for the processing tool can be automatically adjusted (e.g., by a controller in communication with both the processing tool and the interrogation unit(s)). That is, detected frequency response can be measured and used, by a controller, as the basis for adjusting input setting(s) on the processing tool in real-time. For example, during an anneal process performed on a semiconductor wafer by an anneal chamber, detected frequency response can be measured and used, by the controller, as the basis for adjusting the temperature setting(s) of the anneal chamber.

Also disclosed are embodiments of a non-transitory program storage device readable by a computer and tangibly embodying a program of instructions executable by the computer to perform the above-described process control method.

BRIEF DESCRIPTION OF THE SEVERAL VIEWS OF THE DRAWINGS

The embodiments disclosed herein will be better understood from the following detailed description with reference to the drawings, which are not necessarily drawn to scale and in which.

DETAILED DESCRIPTION

Figure 1:
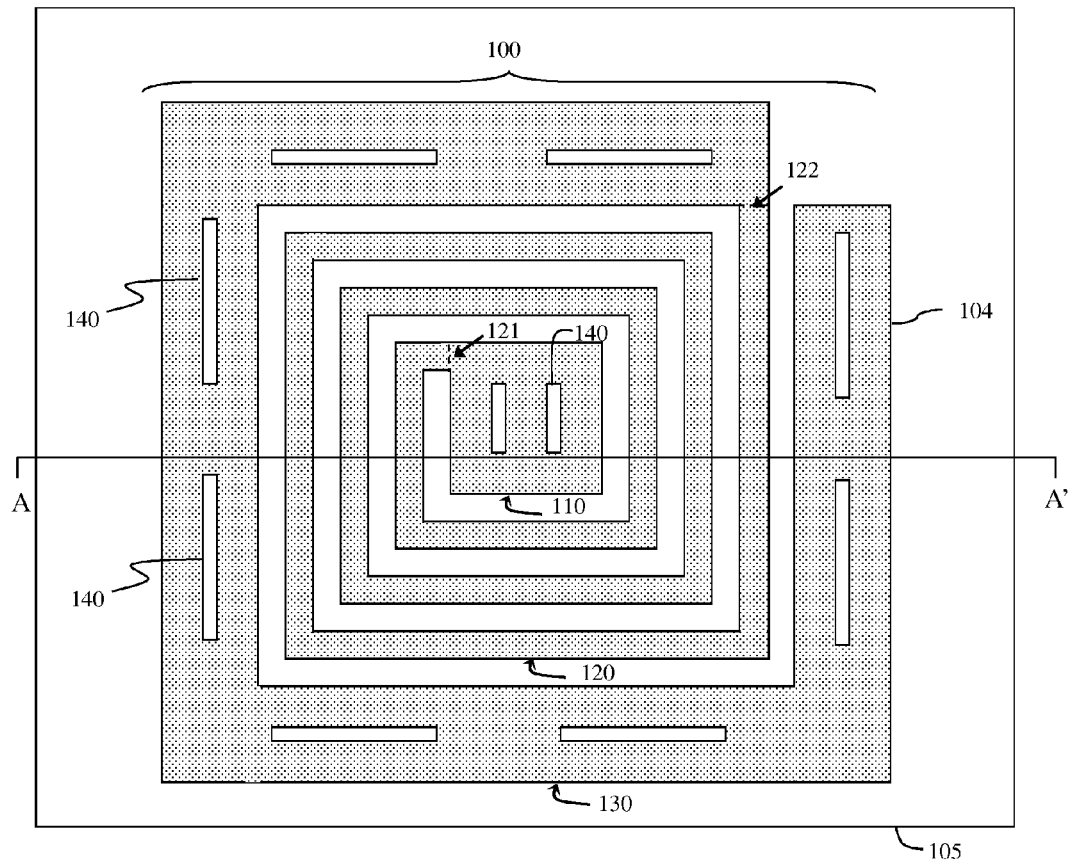
FIG. 1 is a horizontal cross-section diagram illustrating an embodiment of a resonator according to the present invention.

The embodiments of the invention and the various features and advantageous details thereof are explained more fully with reference to the non-limiting embodiments that are illustrated in the accompanying drawings and detailed in the following description.

As mentioned above, as lithographic geometries are reduced for each successive semiconductor process generation, the effects of process variability have become significant first order issues. Designers are faced with creating tradeoffs between timing margin, power, and performance. Tighter process controls enable lower power, higher performance, and/or higher yielding products. However, the ability to control processes to tighter tolerances is limited by difficulties encountered in obtaining actual in-line (i.e., intra-process) measurements for a given wafer or for a given site on a given wafer.

For example, during rapid thermal anneal (RTA) processes, temperature variations can occur between RTA chambers and within a single chamber from wafer to wafer and at different locations on a single wafer. Such temperature variations can result in variations in dopant activation, dopant diffusion rates, etc., and can thereby result in performance variations from chip to chip and/or from device to device on a single chip. Unfortunately, local on-wafer temperature measurements can not generally be obtained during RTA processing. Thus, current RTA process control techniques involve iterative process and measurement sequences that are used to achieve average process conditions between and within RTA chambers. However, such techniques are costly in terms of time and yield. Therefore, there is a need in the art for an on-wafer (e.g., either on-chip or within the scribe-line) structure that allows for intra-process monitoring and, particularly, intra-anneal monitoring of on-wafer conditions (e.g., temperature) and that, thereby allows for real-time process control.

The following U.S. Patent Applications, which are assigned to International Business Machines, Inc. and incorporated herein by reference, disclose on-wafer structures that allow for wireless process monitoring: U.S. Patent Application Publication No. 2009/0239313 of Anemikos et al. and U.S. Patent Application Publication No. 2009/0240452 of Anemikos et al. The on-wafer structures disclosed in these applications are vertically stacked inductor-capacitor-resistor (LCR) structures that typically include at least one metal layer. While such structures are suitable for some intra-process monitoring, they may not be suitable for use in conjunction with processes, such as rapid thermal anneal (RTA) processes, which occur prior to back end of the line (BEOL) metal layer formation.

In view of the foregoing disclosed herein are embodiments of a passive resonator that can be formed in a single semiconductor layer of a semiconductor wafer, that can be used for intra-process monitoring and, particularly, intra-anneal monitoring of on-wafer conditions (e.g., temperature) and that, thereby can be used for real-time process control. This passive resonator can comprise three discrete sections of the same semiconductor layer (i.e., a first section, a second section and a third section). The first section can have a defined shape (e.g., a polygon or oval). The second section can have a first end positioned laterally adjacent to and abutting the first section, a middle portion coiled around the first section (i.e., a planar spiral coil inductor portion wrapped multiple times around the first section), and a second end opposite the first end. The third section can be positioned laterally adjacent to and can abut the second end of the second section. Optionally, the third section can be at least partially wrapped around the second section. Finally, the sizes and shapes of these discrete sections can be such that the first and third sections exhibit a higher capacitance to the wafer substrate than the second section. Also disclosed herein are embodiments of a process control system and an associated method that incorporate one or more of these passive resonators. In the system and method embodiments, during processing by a processing tool, wireless interrogation unit(s) can detect the frequency response of passive resonator(s) in response to an applied stimulus signal. The detected frequency response can be measured and used as the basis for making real-time adjustments to input settings on the processing tool. For example, a measured frequency response of such a passive resonator can be indicative of the resistance exhibited by that resonator and, thereby indicative of the local temperature at that resonator. Thus, during an anneal process by an anneal chamber, measured frequency response of passive resonator(s) can be used as the basis for making real-time adjustments to the temperature setting(s) of the anneal chamber.

Figure 2:
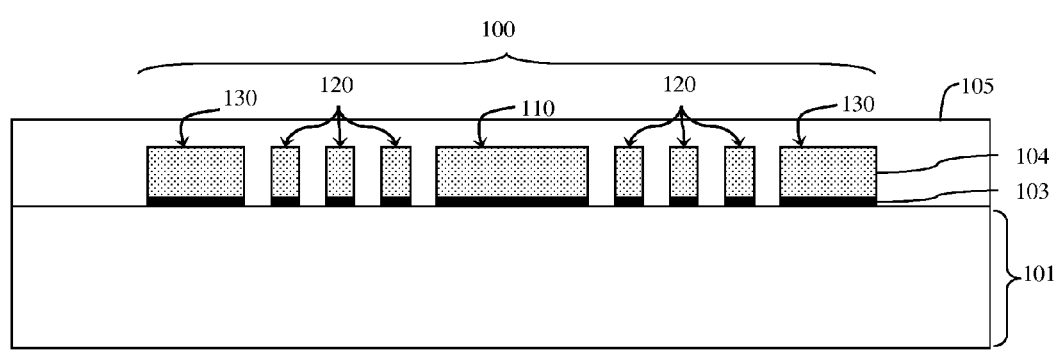
FIG. 2 is a vertical cross-section diagram illustrating the same resonator as shown in FIG. 1.

More particularly, FIG. 1 is a horizontal cross-section illustration of an embodiment of a passive resonator 100 that can be formed in a single semiconductor layer 104 of a semiconductor wafer, that can be used for intra-process monitoring and, particularly, intra-anneal monitoring of on-wafer conditions (e.g., temperature) and that, thereby can be used for real-time process control. FIG. 2 is a vertical cross-section illustration of the same passive resonator 100 (i.e., through the plane A-A', as shown in FIG. 1).

Referring to FIGS. 1 and 2 in combination, this passive resonator 100 can comprise a patterned portion of a semiconductor layer 104 above a semiconductor substrate 101. In one embodiment, the semiconductor layer 104 can comprise a polysilicon layer, such as a gate polysilicon layer above a gate dielectric layer 103, on a semiconductor-on-insulator (SOI) wafer or bulk semiconductor wafer, as shown. In other embodiments, the semiconductor layer 104 can comprise any other semiconductor layer above a semiconductor substrate. For example, the semiconductor layer 104 can comprise a single crystalline silicon layer above an insulator layer of a semiconductor-on-insulator (SOI) wafer. In either case, the passive resonator 100 can comprise three discrete sections within the patterned portion of the semiconductor layer 104 (i.e., a first section 110, a second section 120 and a third section 130).

The first section 110 of the passive resonator 100 can have a defined shape. For example, the first section 110 can be patterned in the shape of a polygon (e.g., a square, as shown, a rectangle, a hexagon, an octagon, etc.) or oval.

The second section 120 of the passive resonator 100 can have a first end 121 positioned laterally adjacent to and abutting the first section 110, a second end 122 opposite the first end 121 and a middle portion between the first end 121 and the second end 122. The middle portion of the second section 120 can be coiled multiple times around the first section 110. Specifically, the middle portion of the second section 120 can comprise a planar spiral coil inductor wrapped multiple times around the first section 110. Each coil in this inductor can have a defined shape that conforms to the shape of the first section 110. For example, if the first section 110 is square, then each coil in the inductor can similarly have an essentially square shape, as shown. Alternatively, each coil in the inductor can have a defined shape that is different from the shape of the first section 110. For example, if the first section 110 is square, each coil in the inductor can have a defined shape that is essentially circular or hexagon or any other suitable shape.

The third section 130 of the passive resonator 100 can be positioned laterally adjacent to and can abut the second end 122 of the second section 120. The third section 130 can also have a defined shape that, optionally, wraps at least partially around the second section 120 (e.g., around at least three sides of the second section 120, as shown).

As mentioned above, these discrete sections 110, 120, 130 of the resonator 100 are patterned from a semiconductor layer 104. Those skilled in the art will recognize that the semiconductor layer 104 will have a sheet resistance with a thermal coefficient that causes changes in resistance as a function of changes in temperature. Thus, the dimensions and shapes of these three discrete sections 110, 120, 130 of the passive resonator 100 can be defined such that the quality (Q) factor of the resonator 100, which represents the effect of electrical resistance, is at a level (e.g., Q>05) sufficient to ensure that the frequency response of the resonator 100 is indicative of the resistance of the resonator and, thereby indicative of the local temperature of the resonator 100. Specifically, the dimensions and shapes of these discrete sections 110, 120, 130 of the passive resonator 100 can be defined such that the width of each coil in the inductor of the second section as well as the overall length of the inductor of the second section allows for the detection of resistivity changes as a function of temperature. That is, the inductor of the second section 120 can be configured so that changes in resistance can be detected in response to changes in temperature. The dimensions and shapes of these discrete sections 110, 120, 130 of the passive resonator 100 can further be defined such that the first and third sections 110, 130 of the resonator 100 each exhibit a significantly higher capacitance to the wafer substrate 101 than the second section 120, thereby raising the quality (Q) factor of the passive resonator 100, which represents the effect of resistance, to a level (e.g., Q>0.5) that is sufficient to ensure that the measured frequency response of the passive resonator 100 (e.g., as measured in terms of Q amplitude vs. frequency) in response to an applied stimulus signal (e.g., a radio frequency energy in the form of a radio frequency pulse or sine voltage applied by a wireless interrogation unit, as discussed in greater detail below) will result in a curve that is indicative of the resistance of the semiconductor material that makes up the passive resonator 100 and, thereby indicative of the local temperature of the passive resonator 100.

Those skilled in the art will recognize that resistivity of the semiconductor layer 104 can be tailored by doping. Different dopants can be used to achieve different conductivity types in different semiconductor materials. For example, P-type conductivity can be achieved in silicon or polysilicon through the use of a Group III dopant, such as boron (B) or indium (In) and N-type conductivity can be achieved in silicon or polysilicon through the use of a Group V dopant, such as arsenic (As), phosphorous (P) or antimony (Sb). However, P-type conductivity can be achieved in gallium nitride (GaN) through the use of, for example, magnesium (MG) and N-type conductivity can be achieved in gallium nitride (GaN) through the use of, for example, silicon (Si). In any case, the resistivity of the semiconductor layer 104 can be decreased by increasing the dopant concentration and the particular resistivity characteristics of the semiconductor layer 104 must be understood so the passive resonator 100 can be designed with a high enough Q factor to resonate. In the embodiments of the passive resonator 100 disclosed herein, there is not a specific dopant concentration requirement. However, the higher the resistivity of the semiconductor layer 104 the better the resonant response. Furthermore, in the embodiments of the passive resonator 100 disclosed herein, there is also no specific requirement regarding the conductivity type of the dopant (e.g., N-type or P-type) because an AC field will be applied between 101 and 103, as shown in FIG. 2.

Additionally, it should be noted the any spaces between the coils of the inductor of the second section 120 and also any spaces between each section 110, 120, 130 can be filled by dielectric material 105. For example, if the passive resonator 100 comprises a patterned portion of a gate polysilicon layer, as shown, then one or more interlayer dielectric materials (e.g., silicon dioxide, silicon nitride, borophosphosilicate glass (BPSG), etc.) can fill the spaces between the coils of the inductor of the second section 120 and between each section 110, 120, 130. Whereas, if the passive resonator 100 comprises a patterned portion of a single crystalline silicon layer of an SOI wafer, then one or more layers of shallow trench isolation (STI) fill materials (e.g., silicon dioxide, silicon nitride, etc.) can fill the spaces between the coils of the inductor of the second section 120 and between each section 110, 120, 130.

Optionally, one or both of the first and third sections 110 and 130 of the passive resonator 100, as described above, can be slotted. That is, the first and/or third sections 110 and 130 can have one or more slots 140 (i.e., narrow elongated depressions, grooves, notches, or openings). In one embodiment, the first and/or third sections 110, 130 each slot 140 can extend vertically completely through the semiconductor layer 104. The same dielectric material(s) that fill the spaces between the coils of the inductor of the second section 120 and between each section 110, 120, 130 can fill the slots 140. Such slots 140 can reduce or eliminate (i.e., can be adapted to reduce or eliminate, configured to reduce or eliminate, etc.) heat generating eddy currents (i.e., Foucault currents), which could otherwise impact the accuracy of any temperature measurement calculated based on the frequency response of the passive resonator 100 in response to an applied stimulus signal.

It should be noted that this passive resonator 100 can be formed as either a scribe line structure (i.e., within the scribe lines of the semiconductor wafer) or, alternatively, as an on-chip structure (i.e., on a chip being formed on the semiconductor wafer).

Figure 3:
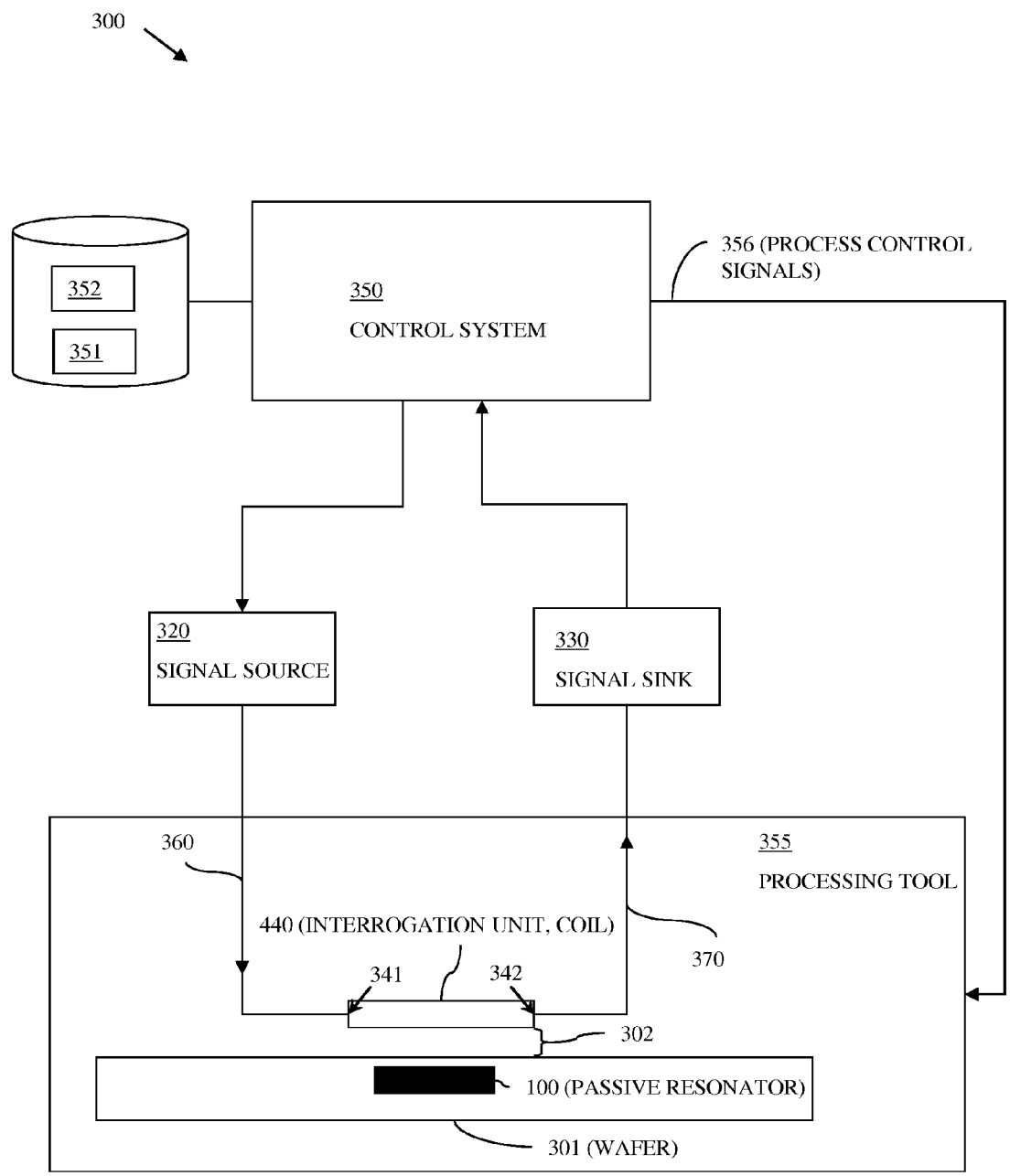
FIG. 3 is a schematic diagram of an embodiment of a process control system according to the present invention, which, as illustrated, incorporates a single passive resonator being interrogated by a single interrogation unit.

Referring to FIG. 3, also disclosed are embodiments of a process control system 300 incorporating at least one passive resonator 100, such as that described in detail above and illustrated in FIGS. 1-2, on a semiconductor wafer 301. Specifically, the process control system 300 can comprise at least a semiconductor wafer 301 with one or more passive resonators 100 formed thereon, a processing tool 355, at least one wireless interrogation unit 340, at least one stimulus source 320, at least one sensor 330 and a controller 350 in communication the interrogation unit(s) 340 via the stimulus source(s) 320 and sensor(s) 330 and further in communication with the processing tool 355.

The processing tool 355 can process (i.e., can be adapted to process, configured to process, etc.) the semiconductor wafer 301. For example, the processing tool 355 can comprise an anneal chamber that performs (i.e., that is adapted to perform, configured to perform, etc.) an anneal process, such as a rapid thermal anneal (RTA) process, on one or more semiconductor wafers. Such anneal chambers are well-known in the art and, thus, the details are omitted from this specification in order to allow the reader to focus on the salient aspects of the invention.

Each passive resonator 100 and each interrogation unit 340 can be uniquely configured so as to allow wireless communication and, particularly, inductive coupling for resonance detection during processing by the process tool 350.

For example, an interrogation unit 340 can comprise an input node 341 that receives (i.e., that is adapted to receive, configured to receive, etc.) a stimulus signal 360 (e.g., a given radio frequency energy in the form of a radio frequency pulse or sine voltage) at one end, an output node 342 at the opposite end and a metal coil that extends from the input node 341 to the output node 342. During processing by the processing tool 355, the interrogation unit 340 can be positioned adjacent to the passive resonator 100 such that the passive resonator 100 and interrogation unit 340 are in close proximity, but physically separated (e.g., by a predetermined distance 302). This close proximity allows the interrogation unit 340 to apply the stimulus signal 360 to the passive resonator 100 and further allows the passive resonator 100 and interrogation unit 340 to be inductively coupled so that the frequency response 370 of the passive resonator 100, in response to the stimulus signal 360, can be detected. To accomplish this, the stimulus source 320 and the sensor 330 can each be electrically connected or otherwise in communication with the input and output nodes 341-342, respectively, of the interrogation unit 340.

A stimulus source 320 can generate and apply (i.e., can be adapted to generate and apply, configured to generate and apply, etc.) the stimulus signal 360 to the passive resonator 100 through the interrogation unit 340. For example, the stimulus source 320 can comprise a pulse generator that generates and applies (i.e., that is adapted to generate and apply, that is configured to generate and apply, etc.) a given radio frequency pulse to the input node 341 of the interrogation unit 340. Alternatively, the stimulus source 320 can comprise a sine sweep generator that generates and applies (i.e., that is adapted to generate and apply, that is configured to generate and apply, etc.) a given sine voltage to the input node 341 of the interrogation unit. Additionally, as mentioned above, the interrogation unit 340 and passive resonator 100 are placed in close proximity such that, during interrogation, they are inductively coupled. Thus, the behavior of the passive resonator 100 in response to the applied stimulus signal 360 will impact the signal at the output node 342 of the interrogation unit 340.

A sensor 330 (i.e., signal sink) can measure (i.e., can be adapted to measure, configured to measure, etc.) the frequency response 370 of the passive resonator 100 in response to the stimulus signal 360, as detected by the interrogation unit 340. That is, the sensor 330 can determine the value of the frequency response 370 in response to the stimulus signal 360. For example, if the stimulus source 320 is a pulse generator, then the sensor 330 can comprise a spectrum analyzer. This spectrum analyzer can measure (i.e., can be adapted to measure, configured to measure, etc.) the response of the resonator 100 at the output node 342 of the interrogation unit 340 and can further generate (i.e., can be adapted to generate, configured to generate, programmed to generate, etc.) a frequency spectrum (e.g., phase and amplitude vs. frequency). Similarly, if the stimulus source 320 is a sine sweep generator, the sensor 330 can comprise a spectrum analyzer that measures the response of the resonator 100. In this case, the spectrum analyzer can further generate an amplitude spectrum and a phase spectrum. Such spectrum analyzer output can then be utilized to calculate the Q factor amplitude at a given target frequency, which in turn can be utilized as a measure of temperature.

It should be understood that the stimulus source 320 and sensor 330 can comprise discrete transmit and receive units connected to the interrogation unit 340, as illustrated. Alternatively, the stimulus source 320 and sensor 330 can comprise a combined transmit and receive unit.

The controller 350 can be in communication with stimulus source 320, with the sensor 330 and with the processing tool 355. The controller 350 can operate (i.e., can be adapted to operate, programmed to operate, etc.) the system 300 in at least two different modes: (1) a production mode for making essentially real-time process control adjustments; and (2) a characterization/setup mode for generating look-up table(s) 351 that are used in the production mode.

In the production mode, the controller 350 can execute (i.e., be adapted to execute) instructions set forth in a process control program 352 stored in memory. Specifically, as directed by the process control program 352, the controller 350 can initiate operation of the stimulus source 320 and thereby initiate interrogation of the passive resonator 100 by the interrogation unit 340. Additionally, the controller 350 can receive the measured frequency response 370 from the sensor 330 and can automatically adjust (i.e., can be adapted to automatically adjust, configured to automatically adjust, programmed to automatically adjust, etc.) an input setting for the processing tool 355 based on that measured frequency response. That is, the detected frequency response of the passive resonator 100 can be measured by the sensor 330 and then used by the controller 350, as the basis for adjusting the process control signals 356 sent to the processing tool 355 during processing (i.e., as the basis for making real-time adjustments).

For example, during an anneal process (e.g., a rapid thermal anneal (RTA) process) performed on a semiconductor wafer 301 by an anneal chamber 355, the stimulus source 320 can generate and apply a given stimulus signal 360 to the passive resonator 100 through the interrogation unit 340. The interrogation unit 340 can detect the frequency response 370 of the passive resonator 100 in response to that stimulus signal 360 and the sensor 330 can measure the frequency response 370 of the passive resonator 100, as detected by the interrogation unit 340. This measured frequency response 370 can be communicated to the controller 350. Next, based on the measured frequency response 370, the controller 350 can calculate the current quality (Q) factor of the passive resonator 100, which represents the effect of electrical resistance and can, thereby determine (i.e., be adapted to determine, configured to determine, programmed to determine, etc.) the local temperature of that particular passive resistor 100 (i.e., the local temperature of the wafer at the passive resonator 100) since the passive resonator 100 is custom designed so that resistance will be indicative of the local temperature.

Figure 4:
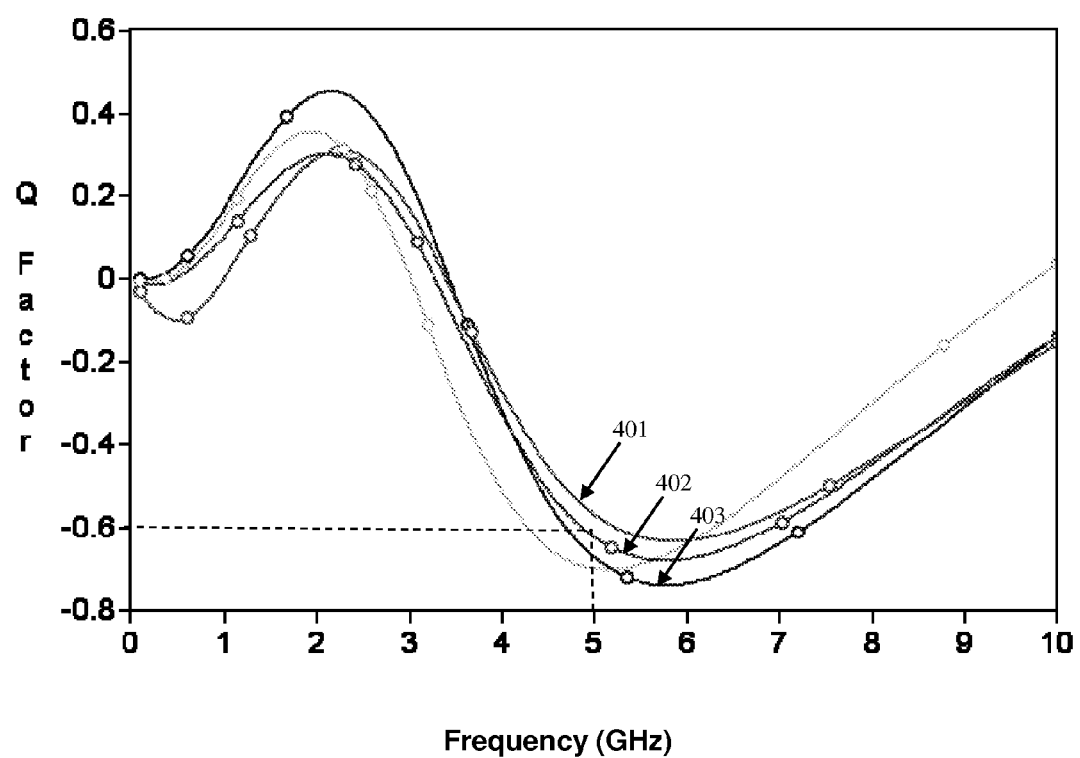
FIG. 4 is a graph of a plurality of response curves illustrating, for an exemplary passive resonator, variations in the calculated Q factor as a result of variations in the measured frequency response at different temperatures.

In the characterization/set up mode, experiments can be performed to determine how the Q factor of a particular passive resonator 100 incorporated into a particular process control system 300 will modulate at different frequencies at different temperatures. Specifically, FIG. 4 is a graph illustrating results of experimentation indicating modulation of the Q factor, as shown on the y-axis, and the measured frequency, as shown on the x-axis, at different temperatures, as shown in the three discrete curves 401, 402, 403 which represent three different temperature simulations for the same passive resonator 100. Such results can be used to generate a look-up table(s) 351, which correlate the calculated Q value and the measured frequency of a particular passive resonator 100 at different temperatures and which can be stored in memory.

In the production mode, the look-up table 351, which was generated in the characterization/set up mode, can be used to infer the local temperature of the passive resonator 100 based on the measuring frequency and the calculating the Q factor. For example, referring to FIG. 4, if, in the production mode, the frequency is measured at 5 GHz and the Q factor is calculated at −0.6, then it can be inferred that the local temperature of the passive resonator is that temperature associated with curve 402. Further accuracy can be obtained by taking a baseline measurement for each passive resonator 100, prior to placing it in the RTA chamber tool. Once the local temperature of the passive resonator 100 is determined, that local temperature can be used by the controller 340 as the basis for adjusting (e.g., increasing or decreasing) a temperature setting of the anneal chamber 355. Specifically, the controller 350 can determine (i.e., can be adapted to determine, configured to determine, programmed to determined, etc.) the difference between the local temperature of the passive resonator 100 and a specified temperature (e.g., the desired anneal temperature) and can automatically adjust (i.e., increase or decrease) a temperature setting on the anneal chamber in order to achieve the specified temperature or to automatically stop the anneal process, when the specified temperature or a temperature vs. time profile is met.

More specifically, in both the characterization/set up mode and the production mode, the process control program 352 can be loaded into the controller 450 when a wafer is loaded into the processing tool 455. The controller 350 can repeatedly cause a stimulus signal 360 to be applied to the input 341 of the interrogation unit 340 via the signal source 320 and can measure the response 370 at the output 342 via the signal sink 330. The measured response will include the parasitic responses of the on-wafer passive resonator 100, which changes in response to the process tool (e.g. temperature of the structure 100), the structure of the interrogation unit 340 itself and the other elements and wiring as shown in FIG. 3.

As mentioned above, the stimulus signal 360 can take any one of various different forms. For example, the stimulus signal 360 can comprise a SINC (sin(x)/x) signal or a short duration impulse signal). The resulting frequency response 370 can comprise a current waveform (e.g., current vs. time) measured by the signal sink 360. This frequency response 370 can then be processed by the controller 350 (e.g., the controller 450 can perform a Fourier transform of this time domain signal). The Fourier transform results provide both an amplitude and phase vs. frequency response of the system, which includes the device under test (DUT) (i.e., the passive resonator 100). Alternatively, the stimulus signal 360 can comprise a sine signal applied at the target frequency (or frequencies). In this case, the resulting frequency response can comprise a current and voltage response, which can be measured by the signal sink 430 (vs. time) and can be further processed by the controller 350 to create amplitude and phase vs. frequency relationships.

Also as mentioned above, the resulting frequency response 370 can be used by the controller 350 to calculate the Q factor of the passive resonator 100. Conventional techniques can be used by the controller 350 to calculate the Q factor and these techniques may vary depending upon the type of measured response 370. For example, if the controller 350 processes the frequency response into a Fourier transform, the controller 350 can further measure the width of a Fourier transform amplitude vs. frequency response around the frequency of interest, with the center measurement point being the peak value, and the left and right sides being that frequency at which a square root of two amplitude of the peak values is measured. The Q factor then becomes the measurement which is correlated to the process parameter of interest (e.g., the local temperature of the passive resonator 100). Other techniques for calculating the Q factor of a resonator based on a frequency response are well-known in the art and, thus, the details are omitted from this specification in order to allow the reader to focus on the salient aspects of the invention.

In the characterization/set up mode, the particular passive resonator 100 as incorporated into the system 300 is characterized in order to establish the mathematical relationship between the frequency response of the particular passive resonator 100 and the target process tool conditions. Specifically, during this characterization mode, the particular passive resonator 100 is interrogated at different process tool conditions in order to experimentally determine the mathematical relationship between the frequency response of the particular passive resonator 100 and the target process tool conditions. The mathematical relationship can then be used to establish lookup table(s) 351, which can be used by the controller 350 in the production mode to make essentially real-time process control adjustments.

For example, if the processing tool 355 is a RTA chamber, a particular passive resonator 100 can first be interrogated with the RTA chamber set at room temperature or some other stable temperature. The wafer can be left in the RTA chamber long enough for the passive resonator 100 to reach the RTA chamber temperature. Next, the passive resonator 100 can be interrogated via the interrogation unit 340 (i.e., a stimulus signal 360 can be applied by the signal source 320 to the input of the interrogation unit 340 and the resulting response 370 at the output of the interrogation unit 340 can be measured by the signal sink 330). The measured response can then be analyzed by the controller 350 (i.e., the controller 350 can calculate the Q factor of the passive resonator 100). These processes can be repeated (e.g., manually or programmatically) for various different higher RTA chamber temperatures, again making sure that the wafer has been left in the RTA chamber long enough for the passive resonator to reach the RTA chamber temperature (e.g., as measured by a native chamber temperature sensor). Based on the results of these processes, the particular passive resonator 100 as incorporated into the system 300 can be characterized in order to establish the mathematical relationship between the frequency response of the particular passive resonator 100 and the target local temperature conditions. From the mathematical relationships, look-up table(s) 351 that correlate the measured response and process parameter (in this case, the Q factor and resistance as well as resistance and temperature) can be generated and stored and the process control program 352 can be updated, as necessary.

In production mode, the particular passive resonator 100 as incorporated into the system 300 is monitored and used to control the process parameter of interest. Specifically, during this production mode, the particular passive resonator 100 is interrogated by the interrogation unit 340 (as discussed in detail above) during processing. The controller 350 then calculates the Q factor based on the measured frequency response 370 and accesses the previously generated look-up table(s) 351 to determine if the results coincide with the target process conditions. If not, input settings on the process control tool can be adjusted accordingly. Such monitoring can also be performed in order to determine if the processing end point has been achieved. Thus, the system 300 incorporating the passive resonator 100 allows for real-time monitoring and control of a target process parameter.

For example, if the processing tool 355 is a RTA chamber, a particular passive resonator 100 can be interrogated by the interrogation unit 340 (as discussed in detail above) during processing. The controller 350 then calculates the Q factor of the resulting frequency response 370 and accesses the previously generated look-up table(s) 351 to determine if the results coincide with the target local temperature for the passive resonator 100. The system 300 can then compensate for any temperature variations within the chamber or can determine that the process end point (e.g., a specific temperature or temperature vs. time profile) has been achieved. Thus, the system 300 incorporating the passive resonator 100 allows for real-time monitoring and control of the local target process temperature.

Figure 5:
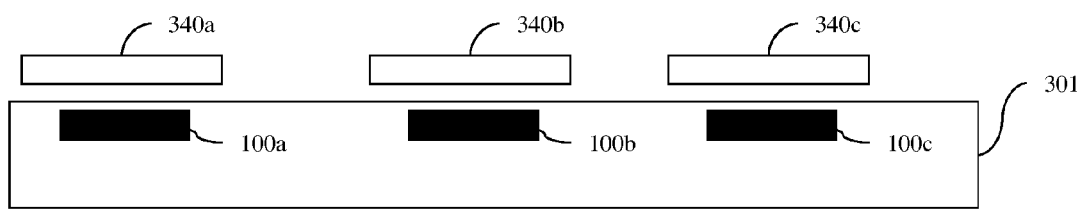
FIG. 5 illustrates an alternative embodiment in which multiple passive resonators being interrogated by corresponding interrogation units.
Figure 6:
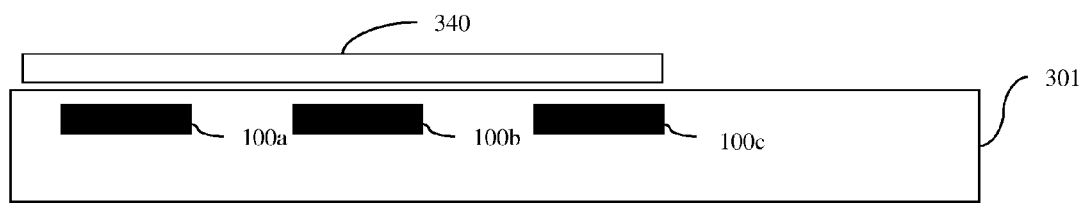
FIG. 6 illustrates another alternative embodiment in which multiple passive resonators are interrogated by a single interrogation unit.

Referring to FIGS. 5 and 6, the above described process control system 300 can optionally incorporate multiple passive resonators 100a-c across the semiconductor wafer 301 so as to allow multiple local intra-process temperatures to be determined and, thereby to allow multiple local temperature settings on the anneal chamber to be automatically adjusted.

Specifically, referring to FIG. 5 in combination with FIG. 3, one embodiment of the process control system 300 can further comprise multiple passive resonators 100a-c on a semiconductor wafer 301 and multiple interrogation units 340a-c for interrogating corresponding passive resonators 100a-c. The passive resonators 100a-c can be at different locations across the semiconductor wafer 301, either in the same semiconductor layer or in different semiconductor layers. Each interrogation unit 340a-c can be positioned adjacent to a corresponding one of the passive resonators 100a-c. During processing by the processing tool 355, each interrogation unit 340a-c can apply a stimulus signal to its corresponding passive resonator 100a-c and can further detect the frequency response of its corresponding passive resonator 100a-c in response to that stimulus signal. As in the previously described embodiment, a stimulus source can generate and apply a given stimulus signal to the passive resonator through each interrogation unit and a sensor can measure the frequency response of each passive resonator in response to the stimulus signal. It should be noted that in this embodiment discrete stimulus sources and sensors can be connected to each interrogation unit. Alternatively, a single stimulus source and a single sensor can be selectively connected (e.g., via a multiplexor) to each interrogation unit 340a-c. Once the frequency responses of each of the passive resonators 100a-c are measured, the controller 350 can calculate corresponding Q factors of the passive resonators 100a-c based on the measured frequency responses, can determine the local temperatures of the passive resonators 100a-c using previously generated and stored look-up tables 351 and based on the corresponding calculated Q factors and measured frequencies, and can automatically adjust local temperature settings within the anneal chamber 355 based on the local temperatures.

Alternatively, referring to FIG. 6 in combination with FIG. 3, another embodiment of the process control system 300 can further comprise multiple passive resonators 100a-c on a semiconductor wafer and a single interrogation unit 340. The passive resonators 100a-c can be at different locations across the semiconductor wafer, either in the same semiconductor layer or in different semiconductor layer. The interrogation unit 340 can be positioned adjacent to each of the passive resonators 100a-c. During processing by the processing tool 355, the interrogation unit 340 can apply a stimulus signal to all of the passive resonators 100a-c and can further detect the combined frequency responses of the passive resonators 100a-c in response to the stimulus signal. To accomplish this, a stimulus source can generate and apply a given stimulus signal to the passive resonators 100a-c through the interrogation unit and a sensor can measure the combined frequency responses of the passive resonators 100a-c in response to the applied stimulus signal. Given the value of the combined frequency responses, the controller 350 can determine the individual frequency responses of each passive resonator 100a-c.

Figure 7:
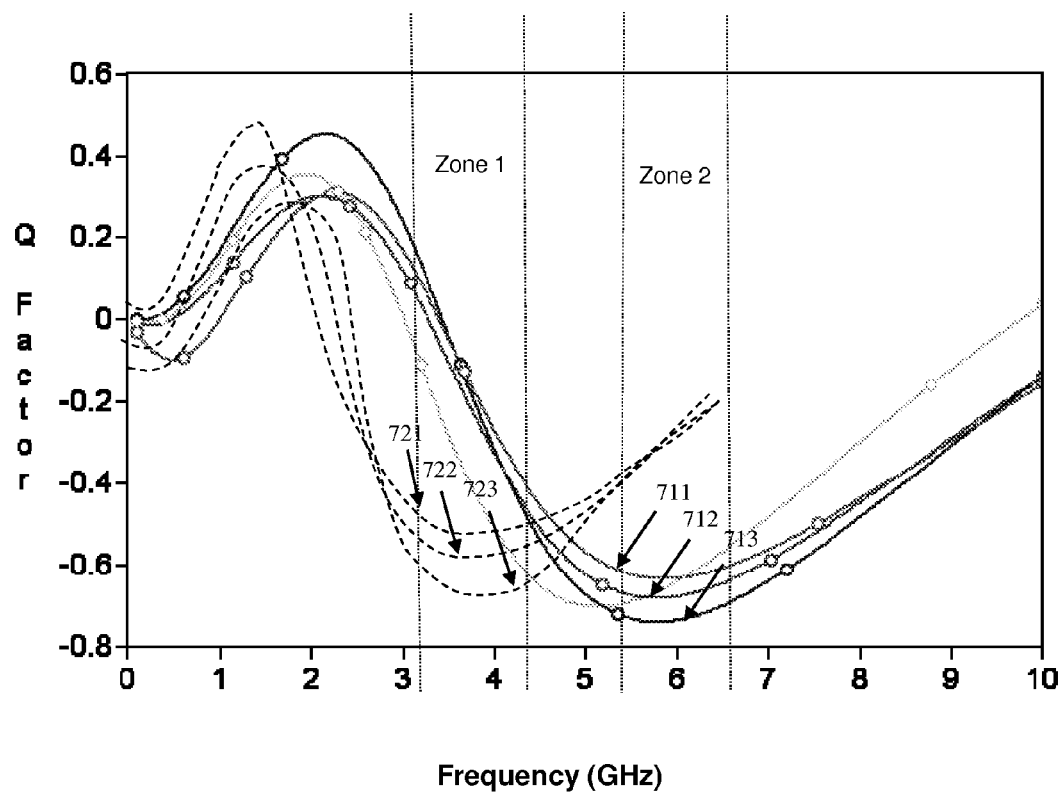
FIG. 7 is a graph of two sets of response curves illustrating, for two discrete passive resonators simultaneously interrogated by a single interrogation, variations in the calculated Q factor as a result of variations in the measured frequency response at different temperatures.

Specifically, when a single 440 interrogation unit is used to interrogate multiple passive resonators 100, as shown in FIG. 6, the multiple sites concurrently being excited and measured must be designed for separated frequency response peaks in the Q curves. For example, referring to FIG. 7, a first passive resonator would be designed to have one set of response curves. Such curves like the curves shown in FIG. 4 and described in detail above, illustrate results of experimentation indicating modulation of the Q factor, as shown on the y-axis, and the measured frequency, as shown on the x-axis, at different temperatures, as shown in the three discrete curves 711, 712, 713 which represent three different temperature simulations for the same first passive resonator. In this case, the response curves have relative quiet zones at 3.5-4.5 GHz (see Zone 1) and 9 GHz and above, and an active zone of interest from 5.5 to 6.5 GHz (see Zone 2). Additionally, a second passive resonator would be designed to have another set of response curves. Such curves would similarly illustrate results of experimentation indicating modulation of the Q factor, as shown on the y-axis, and the measured frequency, as shown on the x-axis, at different temperatures, as shown in the three discrete curves 721, 722, 723 which represent three different temperature simulations for the same second passive resonator. The second passive resonator can specifically be design so that its response curves are active between approximately 3.5 GHz and 4.5 GHz (see Zone 1) and quiet above 4.5 GHz (see Zone 2) and, thus, only minimally impact measurements of the first passive resonator. Procedurally, the multiple passive resonators to be monitored would first be interrogated, prior to wafer processing at room temperature outside the RTA chamber, in order to establish a baseline measurement for those passive resonators at a known temperature. Then, process control tool measurements can be scaled to account for any structure to structure response variations between die sites across wafers.

Once the frequency responses of each of the passive resonators 100a-c are determined, the controller 350 can calculate the corresponding Q factors of the passive resonators 100a-c based on the individual frequency responses, can determine the local temperatures of the passive resonators 100a-c using previously generated and stored look-up tables 351 and based on the corresponding calculated Q factors and measured frequencies, and can automatically adjust local temperature settings within the anneal chamber 355 based on the local temperatures.

Figure 8:
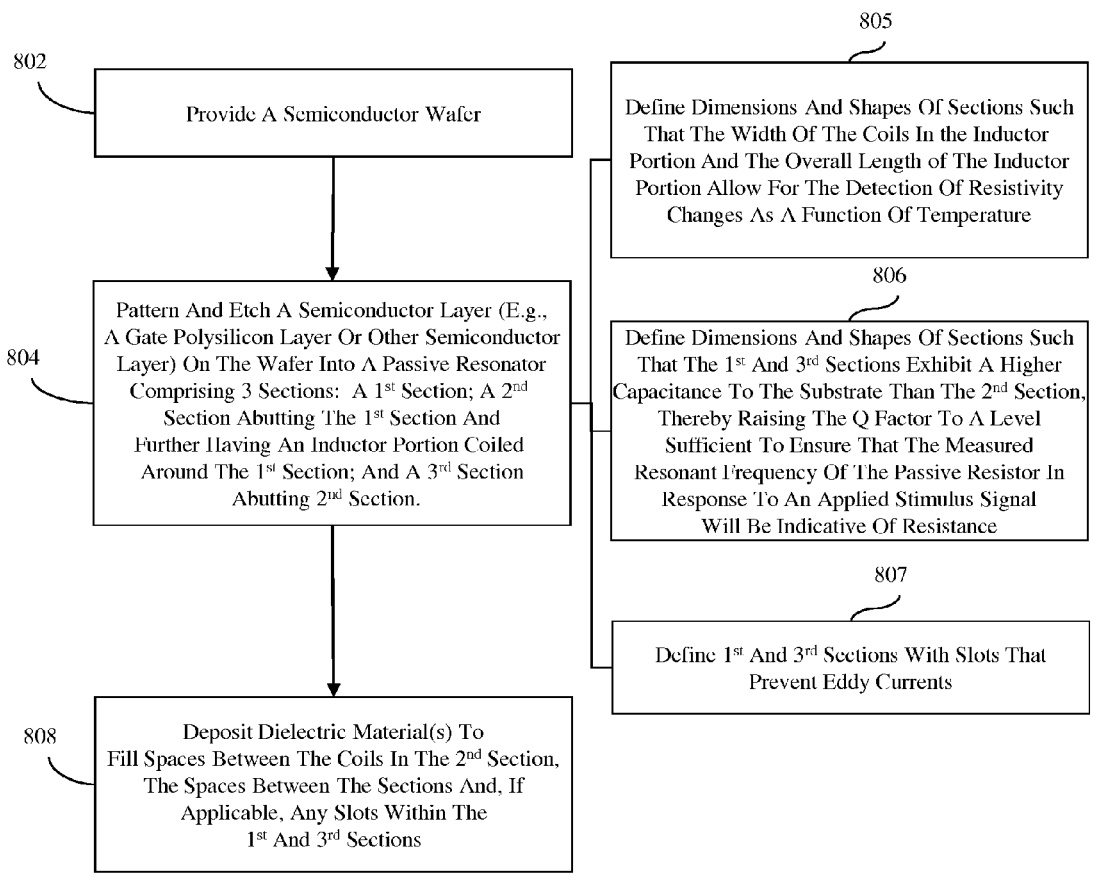
FIG. 8 is a flow diagram illustrating an embodiment of a method of forming a passive resonator.

Referring to FIG. 8, also disclosed herein are embodiments of a method of forming a passive resonator 100 such as that described above and illustrated in FIGS. 1-2. The method of forming the passive resonator 100 can comprise providing a semiconductor wafer (e.g., a semiconductor-on-insulator (SOI) wafer, bulk semiconductor wafer or any other suitable semiconductor wafer) (802). The passive resonator 100 can be patterned (e.g., using conventional lithographic patterning techniques) and etched into a single semiconductor layer 104 on that semiconductor wafer (804). For example, in one embodiment, a gate dielectric layer 103 can be formed on the top surface of the semiconductor wafer. Next, a gate polysilicon layer 104 can be formed on the gate dielectric layer. The passive resonator 100 can then be patterned and etched into a portion of the gate polysilicon layer during the formation of polysilicon gate structures for other devices on the semiconductor wafer. Alternatively, the passive resonator 100 can be patterned and etched into any other semiconductor layer on the semiconductor wafer. For example, the passive resonator 100 can be patterned and etched into a single crystalline silicon layer above an insulator layer of a semiconductor-on-insulator (SOI) wafer. In either case, the passive resonator 100 can be patterned and etched at process 804 such that it comprises three discrete sections of this semiconductor layer 104 (i.e., a first section 110, a second section 120 and a third section 130).

The first section 110 of the passive resonator 100 can be patterned and etch such that it has a defined shape. For example, the first section 110 can be patterned and etched in the shape of a polygon (e.g., a square, as shown, a rectangle, a hexagon, an octagon, etc.) or oval.

The second section 120 of the passive resonator 100 can essentially simultaneously be patterned and etched such that it has a first end 121 positioned laterally adjacent to and abutting the first section 110, a second end 122 opposite the first end 121 and a middle portion between the first end 121 and the second end 122. The second section 120 can further be patterned and etched such that the middle portion is coiled multiple times around the first section 110. Specifically, the second section 120 can be patterned and etched such that the middle portion comprises a planar spiral coil inductor wrapped multiple times around the first section 110. Each coil in this inductor can have a defined shape that conforms to the shape of the first section 110. For example, if the first section 110 is square, then each coil of the inductor can similarly have an essentially square shape, as shown. Alternatively, each coil in this inductor can have a defined shape that is different from the shape of the first section 110. For example, if the first section 110 is square, then each coil in the inductor can have an essentially circular or hexagon or any other suitable shape.

The third section 130 of the passive resonator 100 can essentially simultaneously be patterned and etched such that it is positioned laterally adjacent to and abutting the second end 122 of the second section 120. The third section 130 can also be patterned and etched so as to have a defined shape that, optionally, wraps at least partially around the second section 120 (e.g., around at least three sides of the second section 120, as shown.

Prior to patterning and etching the semiconductor layer 104 at process 804 to form the passive resonator 100, the dimensions and shapes of these discrete sections 110, 120, 130 as well as any doping must be defined. As mentioned above, these discrete sections 110, 120, 130 of the resonator 100 are patterned from a semiconductor layer 104. Those skilled in the art will recognize that the semiconductor layer 104 will have a sheet resistance with a thermal coefficient that causes changes in resistance as a function of changes in temperature. Thus, the dimensions and shapes of these three discrete sections 110, 120, 130 of the passive resonator 100 can be defined such that the quality (Q) factor of the resonator 100, which represents the effect of electrical resistance, is at a level (e.g., Q>05) sufficient to ensure that the frequency response of the resonator 100 is indicative of the resistance of the resonator and, thereby indicative of the local temperature of the resonator 100. Specifically, the dimensions and shapes of the discrete sections 110, 120 and 130 of the passive resonator 100 should be defined such that width of the coils in the inductor of the second section 120 as well as the overall length of that inductor allow for the detection of resistivity changes as a function of temperature (805). That is, the dimensions and shape of the inductor of the second section 120 can be defined so as to allow changes in resistance to be detected in response to changes in temperature. Additionally, the dimensions and shapes of these discrete sections 110, 120, 130 of the passive resonator 100 should be defined such that the first and third sections 110, 130 of the resonator 100 each exhibit a significantly higher capacitance to the wafer substrate 101 than the second section 120, thereby raising the quality (Q) factor of the passive resonator 100 to a level (e.g., Q>0.5) that is sufficient to ensure that the measured frequency response of the passive resonator 100 (e.g., as measured in terms of Q amplitude vs. frequency) in response to an applied stimulus signal (e.g., a given radio frequency energy in the form of a radio frequency pulse or sine voltage applied by a wireless interrogation unit, as discussed in greater detail below) will be indicative of the resistance of the semiconductor material that makes up the passive resonator 100 and, thereby indicative of the local temperature of the passive resonator 100 (806).

Those skilled in the art will recognize that resistivity of the semiconductor layer 104 can be tailored by doping. Different dopants can be used to achieve different conductivity types in different semiconductor materials. For example, P-type conductivity can be achieved in silicon or polysilicon through the use of a Group III dopant, such as boron (B) or indium (In) and N-type conductivity can be achieved in silicon or polysilicon through the use of a Group V dopant, such as arsenic (As), phosphorous (P) or antimony (Sb). However, P-type conductivity can be achieved in gallium nitride (GaN) through the use of, for example, magnesium (MG) and N-type conductivity can be achieved in gallium nitride (GaN) through the use of, for example, silicon (Si). In any case, the resistivity of the semiconductor layer 104 can be decreased by increasing the dopant concentration and the particular resistivity characteristics of the semiconductor layer 104 must be understood so the passive resonator 100 can be designed with a high enough Q factor to resonate. In the embodiments of the passive resonator 100 disclosed herein, there is not a specific dopant concentration requirement. However, the higher the resistivity of the semiconductor layer 104 the better the resonant response. Furthermore, in the embodiments of the passive resonator 100 disclosed herein, there is also no specific requirement regarding the conductivity type of the dopant (e.g., N-type or P-type) because an AC field will be applied between 101 and 103, as shown in FIG. 2.

Once the discrete sections 110, 120, 130 are patterned and etched at process 804, one or more dielectric materials 105 can be deposited so as to fill any spaces between the coils of the inductor of the second section 120 and between each section 110, 120, 130 (808). For example, if the passive resonator 100 is patterned into a portion of a gate polysilicon layer, as shown, then one or more interlayer dielectric materials (e.g., silicon dioxide, silicon nitride, borophosphosilicate glass (BPSG), etc.) can be deposited into the spaces between the coils of the inductor of the second section 120 and between each section 110, 120, 130. Whereas, if the passive resonator 100 is patterned into a portion of a single crystalline silicon layer of an SOI wafer, then one or more layers of shallow trench isolation (STI) fill material (e.g., silicon dioxide, silicon nitride, etc.) can be deposited into the spaces between the coils of the inductor of the second section 120 and between each section 110, 120, 130.

Optionally, one or both of the first and third sections 110 and 130 of the passive resonator 100, as described above, can further be patterned and etched with slots 140 (807). That is, the first and/or third sections 110 and 130 can be patterned and etched so as to have one or more slots 140 (i.e., narrow elongated depressions, grooves, notches, or openings). In one embodiment, the first and/or third sections 110, 130 can specifically be patterned and etched with multiple slots 140 such that each slot extends vertically completely through the semiconductor layer 104. The same dielectric material(s) 105 that are deposited at process 808 to fill the spaces between the coils of the inductor of the second section 120 and between each section 110, 120, 130 can also fill the slots 140. Such slots 140 can reduce or eliminate (i.e., can be adapted to reduce or eliminate, configured to reduce or eliminate, etc.) heat generating eddy currents (i.e., Foucault currents), which could otherwise impact the accuracy of any temperature measurement calculated based on the frequency response of the passive resonator 100 in response to an applied stimulus signal.

It should be noted that the passive resonator 100 can be formed at process 804 as either a scribe line structure (i.e., within the scribe lines of the semiconductor wafer) or, alternatively, as an on-chip structure (i.e., on a chip being formed on the semiconductor wafer).

Figure 9:
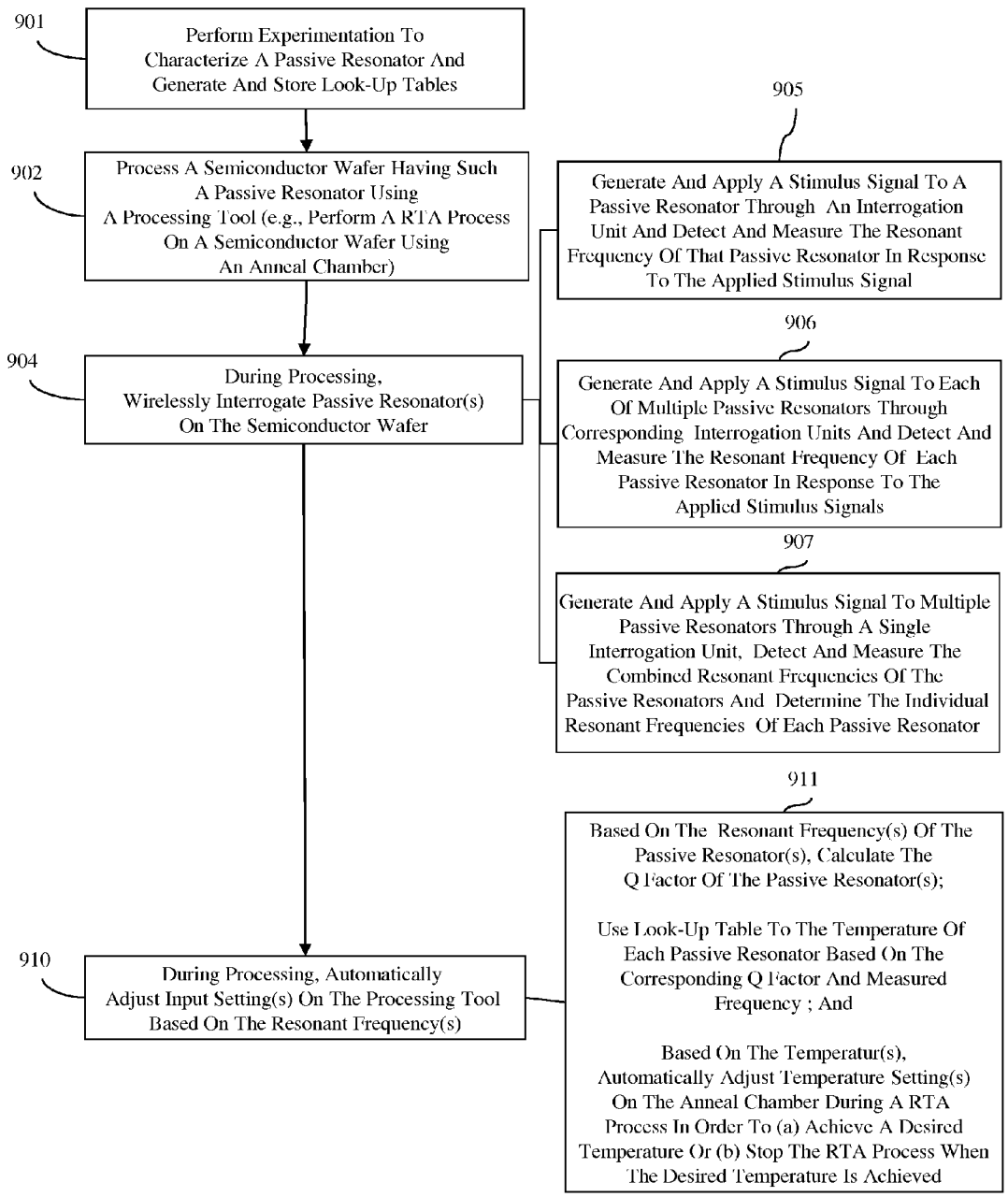
FIG. 9 is a flow diagram illustrating an embodiment of a process control method incorporating one or more passive resonators.

Referring to FIG. 9 in combination with FIG. 3, also disclosed are embodiments of a process control method incorporating at least one passive resonator 100 on a semiconductor wafer 301. This process control method can comprise first characterizing a particular passive resonator 100 (901). Specifically, experiments can be performed to determine how the Q factor of a particular passive resonator 100 incorporated into a particular process control system 300 will modulate at different frequencies at different temperatures. For example, FIG. 4 is a graph illustrating results of experimentation indicating modulation of the Q factor, as shown on the y-axis, and the measured frequency, as shown on the x-axis, at different temperatures, as shown in the three discrete curves 401, 402, 403 which represent three different temperature simulations for the same passive resonator 100. Such results can be used to generate a look-up table(s) 351, which correlate the calculated Q value and the measured frequency of a particular passive resonator 100 at different temperatures and which can be stored in memory.

Next, a semiconductor wafer 301 that incorporates such a passive resonator 100 can be processed using a processing tool 355 (902). For example, the processing tool 355 can comprise an anneal chamber that performs an anneal process, such as a rapid thermal anneal (RTA) process, on one or more semiconductor wafers. Such rapid thermal anneal processes are well-known in the art and, thus, the details are omitted from this specification in order to allow the reader to focus on the salient aspects of the invention.

This process control method can further comprise using a wireless interrogation unit 340 to wirelessly interrogate a passive resonator 100 on the semiconductor wafer during processing (904). Specifically, the passive resonator 100 and the interrogation unit 340 can be uniquely configured so as to allow wireless communication and, particularly, inductive coupling for resonance detection during processing by the process tool 350. For example, the interrogation unit 340 can comprise an input node 341 that receives (i.e., that is adapted to receive, configured to receive, etc.) a stimulus signal 360 (e.g., a given radio frequency energy in the form of a radio frequency pulse or sine voltage) at one end, an output node 342 at the opposite end and a metal coil that extends from the input node 341 to the output node 342. During processing by the processing tool 355, the interrogation unit 340 can be positioned adjacent to the passive resonator 100 such that the passive resonator 100 and interrogation unit 340 are in close proximity, but physically separated (e.g., by a predetermined distance 302). This close proximity allows the interrogation unit 340 to apply the stimulus signal 360 to the passive resonator 100 and further allows the passive resonator 100 and interrogation unit 340 to be inductively coupled so that the frequency response 370 of the passive resonator 100, in response to the stimulus signal 360, can be detected. To accomplish this, a stimulus source 320 and a sensor 330 can each be electrically connected or otherwise in communication with the input and output nodes 341-342, respectively, of the interrogation unit 340.

For example, during this interrogation process 904, a stimulus signal 360 (e.g., a radio frequency pulse or sine voltage) can be generated and applied (e.g., by a stimulus source 320, such as a pulse generator or sine sweep generator, respectively) to the passive resonator 100 through the interrogation unit 340 (905). The close proximity of the interrogation unit 340 and passive resonator 100 allows for inductive coupling such that the behavior of the passive resonator 100 in response to the applied stimulus signal 360 will impact the signal at the output node 342 of the interrogation unit 340. Thus, the interrogation process 904 can further comprise detecting (e.g., by the interrogation unit 340) the frequency response 370 of the passive resonator 100 in response to the applied stimulus signal 360 and measuring (e.g., by a sensor 330) that frequency response 370 (i.e., determining the value of that frequency response 370) (905). It should be noted that, if the stimulus source 320 is a pulse generator, then the sensor 330 can comprise a spectrum analyzer. This spectrum analyzer can measure the response of the resonator 100 at the output node 342 of the interrogation unit 340 and can further generate a frequency spectrum (e.g., phase and amplitude vs. frequency). Similarly, if the stimulus source 320 is a sine sweep generator, the sensor 330 can comprise a spectrum analyzer that measures the response of the resonator 100. In this case, the spectrum analyzer can further generate an amplitude spectrum and a phase spectrum.

The measured frequency response 370 can then be used (e.g., by a controller 350 and as processing is still being performed) as the basis for automatically adjusting an input setting for the processing tool 355 (910). That is, the detected and measured frequency response 370 of the passive resonator 100 can then used as the basis for making real-time process adjustments.

For example, during an anneal process (e.g., a rapid thermal anneal (RTA) process) performed on a semiconductor wafer 301 by an anneal chamber 355 at process 905, a given stimulus signal 360 can be generated and applied to the passive resonator 100 through the interrogation unit 340. The frequency response 370 of the passive resonator 100 in response to that stimulus signal 360 can be detected and measured. Based on the measured frequency response, the Q factor of the passive resonator 100, which represents the effect of resistance, can be calculated (e.g., by a controller 350) (911). Then, using the look-up table 351 generated and stored at process 901, the temperature of that particular passive resistor 100 (i.e., the local temperature of the wafer at the passive resonator 100) can be determined (e.g., by the controller 350) based on the calculated Q factor and the measured frequency (911, see detailed discussion above with regard to the system embodiment). Finally, once the local temperature of the passive resonator 100 is determined, that local temperature can be used (e.g., also by the controller 340) as the basis for adjusting (e.g., increasing or decreasing) a temperature setting of the anneal chamber 355 (911). Specifically, the difference between the determined temperature of the passive resonator 100 and a specified temperature (e.g., the desired anneal temperature) can determined (e.g., by the controller 350) and the temperature setting on the anneal chamber can be automatically adjusted (e.g., increased or decreased) in order to achieve the specified temperature or to automatically stop the anneal process, when the specified temperature or a temperature vs. time profile is met.

The above-described process control method can optionally incorporate multiple passive resonators 100a-c across the semiconductor wafer 301, as shown in FIGS. 5 and 6, so as to allow multiple local intra-process temperatures to be determined and, thereby to allow multiple local temperature settings on the anneal chamber to be automatically adjusted.

Specifically, one embodiment of the process control method can further incorporate the use of multiple passive resonators 100a-c on a single semiconductor wafer 301 and multiple interrogation units 340a-c for interrogating corresponding passive resonators 100a-c (as shown in FIG. 5). The passive resonators 100a-c can be at different locations across the semiconductor wafer 301, either in the same semiconductor layer or in different semiconductor layers. Each interrogation unit 340a-c can be positioned adjacent to a corresponding one of the passive resonators 100a-c. During interrogation at process 904, each interrogation unit 340a-c can apply a stimulus signal to its corresponding passive resonator 100a-c and can further detect the frequency response of its corresponding passive resonator 100a-c in response to that stimulus signal (906). As in the previously described embodiment, a stimulus source can generate and apply a given stimulus signal to the passive resonator through each interrogation unit and a sensor can measure the frequency response of each passive resonator in response to the stimulus signal. It should be noted that in this embodiment discrete stimulus sources and sensors can be connected to each interrogation unit. Alternatively, a single stimulus source and a single sensor can be selectively connected (e.g., via a multiplexor) to each interrogation unit 340a-c. Once the frequency responses of each of the passive resonators 100a-c are measured, the corresponding Q factors of the passive resonators 100a-c can be calculated based on the measured frequency responses, the local temperatures of the passive resonators 100a-c can be determined using previously generated and stored look-up tables 351 and based on the corresponding calculated Q factors and measured frequencies, and local temperature settings within the anneal chamber 355 can be automatically adjust based on the local temperatures (911).

Alternatively, another embodiment of the process control method can incorporate the use of multiple passive resonators 100a-c on a semiconductor wafer and a single interrogation unit 340 (as shown in FIG. 6). The passive resonators 100a-c can be at different locations across the semiconductor wafer, either in the same semiconductor layer or in different semiconductor layer. The interrogation unit 340 can be positioned adjacent to each of the passive resonators 100a-c. During interrogation at process 904, the interrogation unit 340 can apply a stimulus signal to all of the passive resonators 100a-c and can further detect the combined frequency responses of the passive resonators 100a-c in response to the stimulus signal (907). To accomplish this, a stimulus source can generate and apply a given stimulus signal to the passive resonators 100a-c through the interrogation unit and a sensor can measure the combined frequency responses of the passive resonators 100a-c in response to the applied stimulus signal. Given the value of the combined frequency responses, the individual frequency responses of each passive resonator 100a-c can then be determined (e.g., by the controller 350) (see detailed discussion above with regard to the system embodiment). Once the frequency responses of each of the passive resonators 100a-c are determined, the corresponding Q factors of the passive resonators 100a-c can be calculated based on the measured frequency responses, the local temperatures of the passive resonators 100a-c can be determined using previously generated and stored look-up tables 351 and based on the corresponding calculated Q factors and measured frequencies, and local temperature settings within the anneal chamber 355 can be automatically adjust based on the local temperatures (911).

Also disclosed are embodiments of a program storage device readable by a computer and tangibly embodying a program of instructions executable by the computer to perform the above-described process control method. Specifically, as will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable storage medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 10:
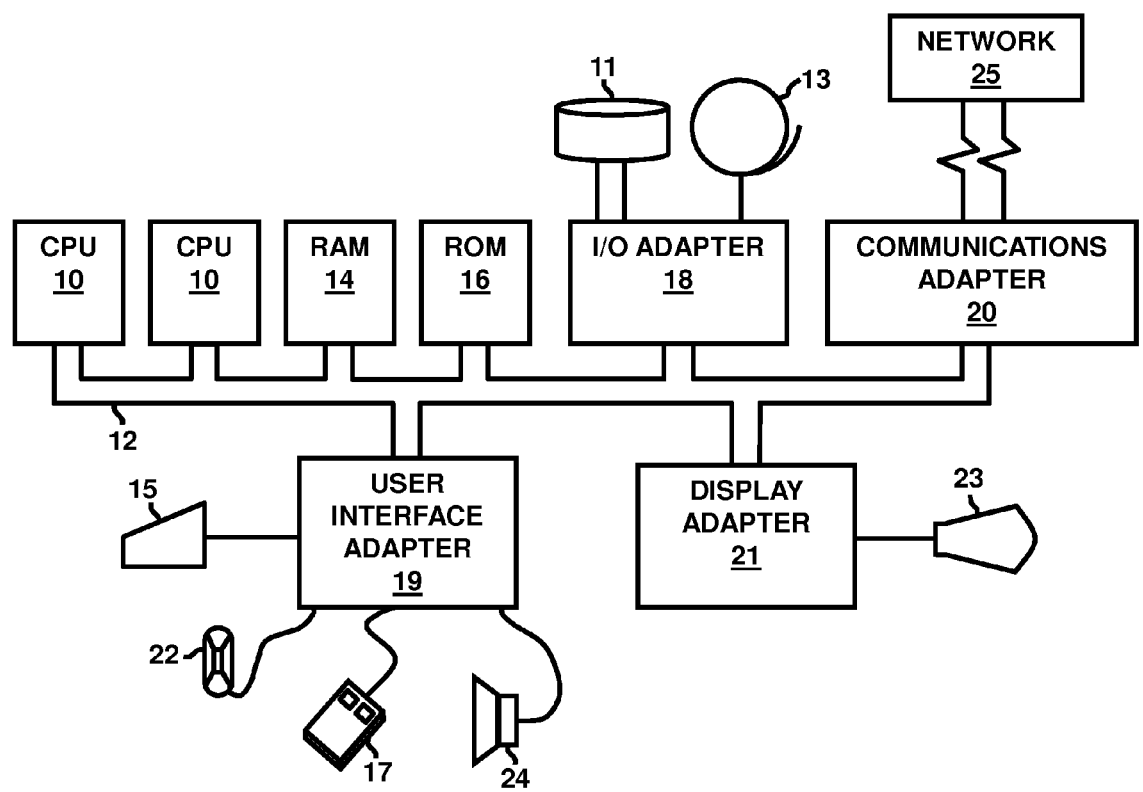
FIG. 10 is a schematic diagram illustrating an exemplary hardware environment that can be used to implement the system and method embodiments.

A representative hardware environment for practicing the embodiments of the invention is depicted in FIG. 10. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should further be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Therefore, disclosed above are embodiments of a passive resonator that can be formed in a single semiconductor layer of a semiconductor wafer, that can be used for intra-process monitoring and, particularly, intra-anneal monitoring of on-wafer conditions (e.g., temperature) and that, thereby can be used for real-time process control. This passive resonator can comprise three discrete sections of the same semiconductor layer (i.e., a first section, a second section and a third section). The first section can have a defined shape (e.g., a polygon or oval). The second section can have a first end positioned laterally adjacent to and abutting the first section, a middle portion coiled around the first section (i.e., a planar spiral coil inductor portion wrapped multiple times around the first section), and a second end opposite the first end. The third section can be positioned laterally adjacent to and can abut the second end of the second section. Optionally, the third section can be at least partially wrapped around the second section. Finally, the sizes and shapes of these discrete sections can be such that the first and third sections exhibit a higher capacitance to the wafer substrate than the second section.

Also disclosed above are embodiments of a process control system and an associated method that incorporate one or more of these passive resonators. In the system and method embodiments, during processing by a processing tool, wireless interrogation unit(s) can detect the frequency response of passive resonator(s) in response to an applied stimulus signal. The detected frequency response can be measured and used as the basis for making real-time adjustments to input settings on the processing tool. For example, a measured frequency response of such a passive resonator can be indicative of the resistance exhibited by that resonator and, thereby indicative of the local temperature at that resonator. Thus, during an anneal process by an anneal chamber, measured frequency response of passive resonator(s) can be used as the basis for making real-time adjustments to the temperature setting(s) of the anneal chamber.

As mentioned above, a passive resonator, such as that described above and illustrated in FIGS. 1-2, can be formed as a scribe line structure (i.e., within the scribe lines of the semiconductor wafer) or, alternatively, as an on-chip structure (i.e., on a chip being formed on the semiconductor wafer). Those skilled in the art will recognize that in addition to being used for intra-processing monitoring and control, as discussed in detail above, an on-chip passive resonator may similarly be wirelessly interrogated for post-production purposes. For example, an on-chip passive resonator could also be wirelessly interrogated for temperature sensing during testing and/or in the field.

What is claimed is:

1. A process control system comprising:
   a processing tool processing a semiconductor wafer, said processing tool comprising an anneal chamber, said processing comprising annealing and said semiconductor wafer comprising a resonator and said resonator comprising:
      a first section of a semiconductor layer;
      a second section of said semiconductor layer, said second section having a first end positioned laterally adjacent to and abutting said first section, a second end opposite said first end and a middle portion between said first end and said second end, said middle portion being coiled around said first section; and
      a third section of said semiconductor layer, said third section being positioned laterally adjacent to and abutting said second end;
   an interrogation unit adjacent to said resonator, said interrogation unit applying a stimulus to said resonator during said annealing and further detecting a frequency response of said resonator in response to said stimulus; and,
   a controller in communication with said interrogation unit and said processing tool, said controller automatically adjusting an input setting for said anneal chamber during said annealing based on said frequency response,
   said frequency response being indicative of a resistance of said resonator,
   said resistance being indicative of a temperature of said resonator,
   said input setting comprising a temperature setting for said anneal chamber, and
   said automatically adjusting of said input setting comprising:
      determining, during said annealing, said temperature of said resonator based on said resistance by using a previously generated look-up table;
      determining, during said annealing, a difference between said temperature and a specified temperature; and,
      after said determining, automatically performing any of the following:
         adjusting said temperature setting in order to achieve said specified temperature; and,
         stopping said annealing when said temperature is equal to said specified temperature.

2. The process control system of claim 1, further comprising:
   a stimulus source generating said stimulus and applying said stimulus to said resonator through said interrogation unit; and
   a sensor measuring a value of said frequency response as detected by said interrogation unit.

3. The process control system of claim 1, said resonator having a Quality (Q) factor sufficient to ensure that said frequency response as detected by said interrogation unit is indicative of said resistance of said resonator.

4. The process control system of claim 1,
   said semiconductor wafer further comprising multiple resonators at different locations in said semiconductor layer, each of said resonators having a Quality (Q) factor sufficient to ensure that frequency responses of said resonators are indicative of corresponding resistances of said resonators, said corresponding resistances further being indicative of local temperatures of said resonators, and
   said process control system further comprising multiple interrogation units adjacent to said resonators, said multiple interrogation units detecting said frequency responses of said resonators during annealing of said semiconductor wafer by said anneal chamber, and
   said controller further determining said corresponding resistances of said resonators based on said frequency responses-, determining local temperatures of said resonators based on said corresponding resistances, and automatically adjusting local temperature settings within said anneal chamber based on said local temperatures.

5. The process control system of claim 1,
   said semiconductor wafer further comprising multiple resonators at different locations in said semiconductor layer, each of said resonators having a Quality (Q) factor sufficient to ensure that frequency responses of said resonators are indicative of corresponding resistances of said resonators, said corresponding resistances further being indicative of local temperatures of said resonators,
   said interrogation unit detecting combined frequency responses of said resonators during annealing of said semiconductor wafer by said anneal chamber, and
   said controller further determining said frequency responses of each of said resonators, determining said corresponding resistances of said resonators based on said frequency responses, determining local temperatures of said resonators based on said corresponding resistances, and automatically adjusting local temperature settings within said anneal chamber based on said local temperatures.

6. A process control method comprising:
processing, by a processing tool, a semiconductor wafer, said processing tool comprising an anneal chamber, said processing comprising annealing and said semiconductor wafer comprising a resonator and said resonator comprising:
  a first section of a semiconductor layer;
  a second section of said semiconductor layer, said second section having a first end positioned laterally adjacent to and abutting said first section, a second end opposite said first end and a middle portion between said first end and said second end, said middle portion being coiled around said first section; and
  a third section of said semiconductor layer, said third section being positioned laterally adjacent to and abutting said second end;
detecting, by an interrogation unit adjacent to said resonator, a frequency response of said resonator in response to a stimulus applied to said resonator during said annealing; and
automatically adjusting, by a controller and based on said frequency response, an input setting for said anneal chamber during said annealing,
  said frequency response being indicative of a resistance of said resonator,
  said resistance being indicative of a temperature of said resonator,
  said input setting comprising a temperature setting for said anneal chamber, and
  said automatically adjusting of said input setting comprising:
    determining, during said annealing, said temperature of said resonator based on said resistance by using a previously generated look-up table;
    determining, during said annealing, a difference between said temperature and a specified temperature; and,
    after said determining, automatically performing any of the following:
      adjusting said temperature setting in order to achieve said specified temperature; and,
      stopping said annealing when said temperature is equal to said specified temperature.

7. The process control method of claim 6, further comprising:
applying, by a stimulus source, said stimulus to said resonator through said interrogation unit; and
measuring, by a sensor, a value of said frequency response as detected by said interrogation unit.

8. The process control method of claim 6, said resonator having a Quality (Q) factor sufficient to ensure that said frequency response is indicative of said resistance of said resonator.

9. The process control method of claim 6,
said semiconductor wafer further comprising multiple resonators at different locations in said semiconductor layer, each of said resonators having a Quality (Q) factor sufficient to ensure that frequency responses of said resonators are indicative of corresponding resistances of said resonators, said corresponding resistances further being indicative of local temperatures of said resonators,
said process control method further comprising:
  detecting, by multiple interrogation units adjacent to said resonators and in communication with said controller, said frequency responses of said resonators during said annealing;
  determining, by said controller, said corresponding resistances of said resonators based on said frequency responses; and
  determining, by said controller, local temperatures of said resonators based on said corresponding resistances, and
said automatically adjusting comprising automatically adjusting local temperature settings within said anneal chamber based on said local temperatures.

10. The process control method of claim 6,
said semiconductor wafer further comprising multiple resonators at different locations, each of said resonators having a Quality (Q) factor sufficient to ensure that frequency responses of said resonators are indicative of corresponding resistances of said resonators, said corresponding resistances further being indicative of local temperatures of said resonators,
said process control method further comprising:
  detecting, by said interrogation unit, combined frequency responses of said resonators during said annealing;
  determining, by said controller, said frequency responses for each of said resonators;
  determining, by said controller, said corresponding resistances of said resonators based on said frequency responses; and
  determining, by said controller, local temperatures of said resonators based on said corresponding resistances, and
said automatically adjusting comprising automatically adjusting local temperature settings within said anneal chamber based on said local temperatures.

11. A non-transitory program storage device readable by a computer and tangibly embodying a program of instructions executable by said computer to perform a method for controlling processing of a semiconductor wafer by a processing tool,
said processing tool comprising an anneal chamber,
said processing comprising annealing,
said semiconductor wafer comprising a resonator,
said resonator comprising:
  a first section of a semiconductor layer;
  a second section of said semiconductor layer, said second section having a first end positioned laterally adjacent to and abutting said first section, a second end opposite said first end and a middle portion between said first end and said second end, said middle portion being coiled around said first section; and,
  a third section of said semiconductor layer, said third section being positioned laterally adjacent to and abutting said second end, and
said method comprising:
detecting a frequency response of said resonator in response to an applied stimulus during said annealing of said semiconductor wafer by said anneal chamber; and,
automatically adjusting an input setting for said anneal chamber during said annealing based on said frequency response,
  said frequency response being indicative of a resistance of said resonator, said resistance being indicative of a temperature of said resonator, said input setting comprising a temperature setting for said anneal chamber, and said automatically adjusting of said input setting comprising:

determining, during said annealing, said temperature of said resonator based on said resistance by using a previously generated look-up table;

determining, during said annealing, a difference between said temperature and a specified temperature; and, after said determining, automatically performing any of the following:

adjusting said temperature setting in order to achieve said specified temperature; and stopping said annealing when said temperature is equal to said specified temperature.

12. The program storage device of claim 11, said resonator having a Quality (Q) factor sufficient to ensure that said frequency response is indicative of said resistance of said resonator.

\* \* \* \* \*